US005374828A

United States Patent [19]

[11] Patent Number: 5,374,828

[45] Date of Patent: Dec. 20, 1994

Boumsellek et al.

[54] ELECTRON REVERSAL IONIZER FOR DETECTION OF TRACE SPECIES USING A SPHERICAL CATHODE

[75] Inventors: Said Boumsellek, Pasadena; Ara Chutjian, La Crescenta, both of Calif.

[73] Assignee: The United States of America as represented by the Administrator of the National Aeronautics and Space Administration, Washington, D.C.

[21] Appl. No.: 127,653

[22] Filed: Sep. 15, 1993

[51] Int. Cl.[5] ........................ H01J 37/08; H01J 49/00; B01D 59/44

[52] U.S. Cl. ........................ 250/427; 250/288

[58] Field of Search ........................ 250/427, 288

[56] References Cited

U.S. PATENT DOCUMENTS

| | | | |
|---|---|---|---|
| 4,023,061 | 5/1978 | Berwick et al. | 313/349 |
| 4,593,230 | 6/1986 | True | 315/14 |
| 4,649,278 | 3/1987 | Chutjian et al. | 250/427 |
| 4,739,214 | 4/1988 | Barr | 250/423 R |
| 4,782,235 | 11/1988 | Lejeune | 250/423 R |
| 4,933,551 | 6/1990 | Bernius et al. | 250/288 |
| 5,256,874 | 10/1993 | Chutjian | 250/288 |

OTHER PUBLICATIONS

S. Bounsellek, S. H. Alajajian and A. Chutjian, "Negative-Ion Formation in the Explosives RDX, PETN, and TNT Using the Reversal Electron Attachment Detection Technique", Am. Soc. for Mass Spectrometry 1992, 3, pp. 243–247.

*Primary Examiner*—Bruce C. Anderson
*Attorney, Agent, or Firm*—John H. Kusmiss; Thomas H. Jones; Guy M. Miller

[57] ABSTRACT

A reversal electron, high-current ionizer capable of focusing a beam of electrons to a reversal region employs an indirectly heated cathode having a concave emitting surface of width W<2r, where r is the radius of curvature and preferably a ratio of width to radius approximately equal to one for optimum high current for a given cathode width.

3 Claims, 6 Drawing Sheets

ELECTRON REVERSAL IONIZER FOR DETECTION OF TRACE SPECIES USING A SPHERICAL CATHODE

ORIGIN OF INVENTION

The invention described herein was made in the performance of work under a NASA contract, and is subject to the provisions of Public Law 96-517 (35 USC 202) in which the contractor has elected not to retain title.

TECHNICAL FIELD

The invention relates to a high-sensitivity ionizer for trace species detection and more particularly to an improvement of the in-line reversal electron, high-current ionizer for detection of trace species disclosed in U.S. Pat. No. 4,933,551.

BACKGROUND ART

In the search for high sensitivity and direct atmospheric sampling of trace species, techniques have been developed such as atmospheric sampling, glow-discharge ionization (ASGDI), atmospheric pressure ionization (API), electron capture detection (ECD) and negative-ion chemical ionization (NICI) that are capable of detecting parts-per-billion to parts-per-trillion concentrations of trace species, including explosive, in ambient air. These techniques are based on positive or negative ion formation via charge transfer to the target, or electron capture under multi-collision conditions in a Maxwellian distribution of electron energies [with a peak at about 40 millielectron volts (meV)] at the source temperature (300 K). Subsequent detection of the ion-molecule reaction products or the electron-attachment products is carried out by using time-of-flight, quadrupole, magnetic-sector, ion-trap or analog-current measurement methods.

One drawback of the high-pressure, corona- or glow-discharge devices is that they are susceptible to interferences either through indistinguishable product masses, or through undesired ion-molecule reactions. The ASGDI technique is relatively immune from such interferences, since at target concentrations of $<1$ ppm the majority of negative ions arises via electron capture rather than through ion-molecule chemistry. A drawback of the conventional ECD, and possibly of the ASGDI, is that they exhibit vanishingly small densities of electrons with energies in the range 0–10 meV, as can be seen from a typical Maxwellian electron energy distribution function at $T=300$ K. Higher electron currents are needed at low ($<10$ meV) energies.

Slowing the electrons to these subthermal ($<10$ meV) energies is crucial because the cross section for attachment of several large classes of molecules (including the explosives, chlorohalocarbon compounds and perfluorinated carbon compounds) is known to increase to values larger than $10^{-12}$ $cm^2$ at near-zero electron energies. In fact, in the limit of zero energy, these cross sections are predicted to diverge as $\epsilon^{-\frac{1}{2}}$, where $\epsilon$ is the electron energy. This is a direct consequence of the Wigner threshold law for electron attachment.

To provide a better "match" between the electron energy distribution function and the attachment cross section, a new concept of attachment in an electrostatic mirror was developed referred to hereinafter as the electron reversal technique. In that technique, electrons were brought to a momentary halt by reversing their direction with electrostatic fields. At a reversal region R, the electrons have zero or near-zero energy. A beam of target molecules is introduced, and the zero or near-zero energy electrons are attached to the molecules of the beam. The resultant negative ions may then be easily extracted. This basic electron reversal technique has been improved by Mark T. Bernius and Ara Chutjian as described in U.S. Pat. No. 4,933,551 to allow for better reversal geometry, higher electron currents, lower backgrounds and increased negative-ion extraction efficiency.

In the application of the electron reversal technique to detection of the molecules of explosives RDX, PETN, and TNT by negative-ion formation under single-collision conditions, the fact that these molecules are known to attach thermal-energy electrons is exploited for detection of trace species, but for zero-energy electrons higher electron current is needed for the electron reversal technique. Improvements in this regard by the present invention permits a factor of about 25 increase in detection sensitivity for these classes of zero electron-energy attaching molecules, including the explosives.

The electron reversal technique is a new analytical tool which differs in several significant ways from other methods. Because this technique builds up electron density in the energy region of maximum attachment cross section, attachment (ionization) efficiencies are expected to be high. Indeed, the sensitivity of this technique to the detection of $Cl^-$ ions from $CCl_4$ has been measured to be 10 pptr with a counting rate of 900 Hz. Neither attachment cross sections nor rate constants for the explosives are available. Assuming values comparable to $CCl_4$, this would give a sensitivity of the electron reversal technique in the design of the present invention of pptr (90 Hz) to explosives.

Unlike the ASGDI, API, ECD or NICI techniques, negative-ion generation by electron reversal is also able to access resonance at $\epsilon > 0$, beyond the range of thermalized energies. This is accomplished by shifting the location of the electron turning point with respect to the target beam. Furthermore, because measurements are carried out under single-collision conditions, there is no secondary ion-molecule chemistry. Finally, by detecting product masses, this electron reversal technique is capable of identifying one or more "signature" ions in the attachment process. In applications where time is not critical, the use of several mass detectors to detect products concurrently would be feasible. This could mitigate strongly against interferences, reduce false alarms, and could even identify directly which type(s) of explosives are being detected.

Notwithstanding developments in other prior art techniques, there exists a need in trace-species analysis detectors that are sensitive, specific, and resistant to interferences from nontargeted chemical components. The reversal electron technique utilizes the fact that there are many classes of molecules which have negative-ion resonances at low energies (below about 5 eV) and hence can form one or more negative ions upon electron attachment. However, the sensitivity of such a device will depend upon, among other factors, the space-charge limited electron current at the resonance energy that can be delivered to the reversal region. Consequently, improvement in the electron current source is important. This is especially critical for explosives detection where the explosives vapor pressures are extremely low ($10^{-9}$ torr for RDX, for instance).

STATEMENT OF THE INVENTION

In accordance with the present invention, an indirectly heated spherical cathode capable of emitting higher electron currents is provided in apparatus for the electron reversal technique used in apparatus for negative-ion formation in a detector for a plurality of important classes of molecules such as explosives RDX, PETN and TNT and several halogenated molecules. The term "spherical cathode" as used herein is defined as a cathode having a concave surface for emitting electrons that is part of a hemisphere. In the present application, the cathode has a spherical radius of $8.2\times10^{-3}$ m, and total emitting area of $5.6\times10^{-5}$ m$^2$. Free electrons from the spherical cathode are electrostatically focused into a beam along a predetermined axis to a reversal region where an electrode at a more negative potential than electrodes for electrostatically focusing the free electrons reverses their trajectories. In the reversal region, electrons have essentially zero energy and attach to target molecules to form negative ions. The entire electrostatically-focusing system was designed using a fields-and-trajectories code with space charge included. Sensitivity of the apparatus is approximately 25 times greater than for prior apparatus using the electron reversal technique.

DETAILED DESCRIPTION OF THE INVENTION

Figure 1A:
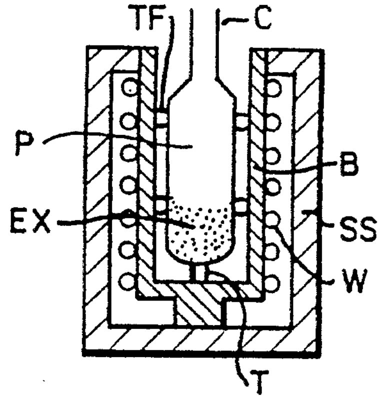
FIG. 1 is a schematic diagram of the present invention with detail of the explosives sample tube shown in FIG. 1*a*.
Figure 1:
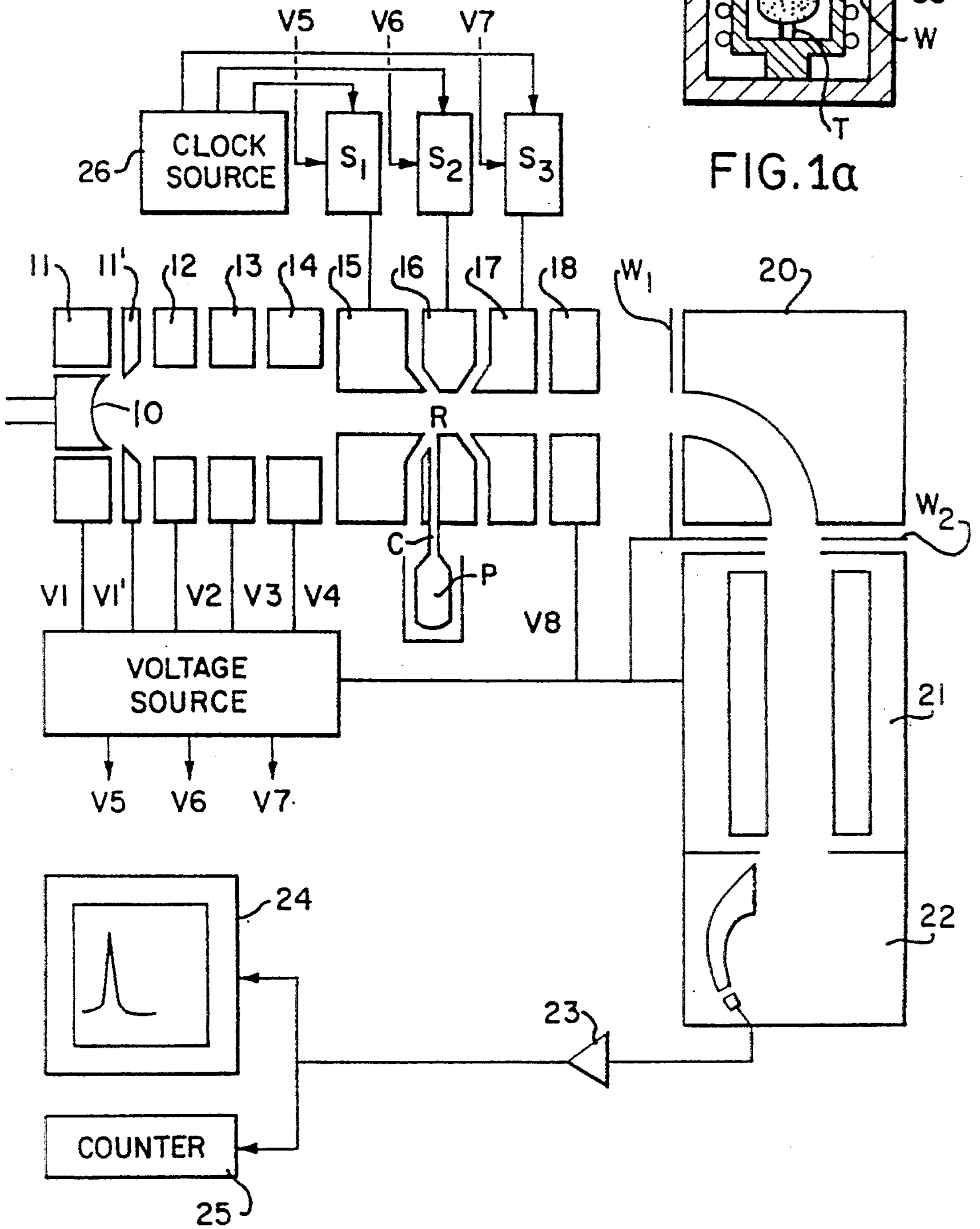

A schematic diagram of the present invention is shown in FIG. 1. It consists of an indirectly-heated cathode 10 from which electrons are extracted, focused and accelerated by a five-element lens system comprising elements 11 through 15, into an electrostatic reversal means comprising lens elements 15, 16 and 17 that decelerates the electron beam to zero longitudinal and radial velocity at the reversal plane R between lens elements 15 and 16. Free electrons extracted from the spherical cathode 10 are focused into a narrow beam with a shim element 11' and accelerated by a system comprising lens elements 11 through 15. They are then focused into an electrostatic reversal region R by elements 15 through 17 which decelerates the electrons to zero longitudinal velocity and near-zero radial velocity at virtually a common plane in the region R which is commonly referred to as a "mirror." At the reversal plane, the zero or near-zero velocity electrons are crossed by a beam of molecules from a sample.

The electron beam is square-wave modulated by fast switches $S_1$–$S_3$ with a nearly 50% duty cycle. These switches are power MOSFET-based to ensure fast (50 ns) rise times between full-floating lens voltage. Electron attachment to the sample molecules takes place at the reversal plane R during one half of the duty cycle when the electrons are "ON". The resulting negative ions are extracted during the second half of the duty cycle (electron beam is "OFF") and focused by lens elements 16, 17 and 18 onto the entrance plane $W_1$ of a 90° electrostatic analyzer (ESA) 20. The extracted ions are then deflected by the ESA to insure the sign of charge, and further focused onto the entrance plane $W_2$ of a quadrupole mass analyzer (QMS) 21.

Electrons are thus generated at the electrode 10 and accelerated into the reversal region R where attachment or dissociative attachment (DA) to sample molecules takes place. Fast switches $S_1$–$S_3$ pulse electrons on during one-half cycle, then pulse negative ions out towards the electrostatic analyzer 20 during the second half. Ions selected by the ESA are focused into the QMS and individual masses detected at the channel electron multiplier (CEM) 22. The ion signal produced by the CEM is amplified by an amplifier 23. The intensity of each mass peak is displayed on an oscilloscope 24 and counted after a 10 second integration period by a counter 25. A clock synchronizer 26 controls the pulse width and frequency of the switches $S_1$, $S_2$ and $S_3$, i.e., the pulsing of the electron beam, and extraction of the product negative ions. The oscilloscope 24 and counter 25 are synchronized by scan drive means (not shown) for the QMS.

Referring to FIG. 1*a* as an example of the detection of explosives in a sample of solid material and without limitation of the invention to this example, the solid target is placed in a Pyrex bulb P inside a vacuum chamber (not shown). The vapor pressures of 300 K of RDX, PETN and TNT are quite low: $8.5\times10^{-7}$, $2.7\times10^{-6}$ and $1.3\times10^{-3}$ Pa, respectively. Consequently, the bulb P has to be heated with nichrome wire W wound around an inside body B supported by Teflon spacers TF in an outside body SS of stainless steel. The resulting vapor is conducted to the reversal region R through a conduit C comprising a heated stainless-steel tube. Typical required temperatures, as read with a copper-constantan thermocouple T are 343 K for TNT and 378 K for RDX and PETN. Operating pressures in the vacuum chamber (not shown) are $(5.3–13)\times10^{-3}$ Pa. In applications requiring the detection of molecules of explosives, for example, already in a vapor form, the apparatus of FIG. 1*a* would be replaced by a system for taking a vapor sample and introducing it through the conduit C into the reversal region R.

Careful consideration must be given to both electron and ion space-charge effects in the apparatus. Intense space charge is encountered many times: (a) at the cathode, where electron currents are high and velocities low; (b) at an intermediate cross-over in element 13 of the focusing and acceleration lens system (see FIG. 2); (c) at the electron reversal region R where currents are again high, and the electrons are slowed to zero and near-zero longitudinal and radial velocities; and (d) again at the region R where the slow-moving negative ions are formed in the presence of the negative (electron) space charge.

Figure 2:
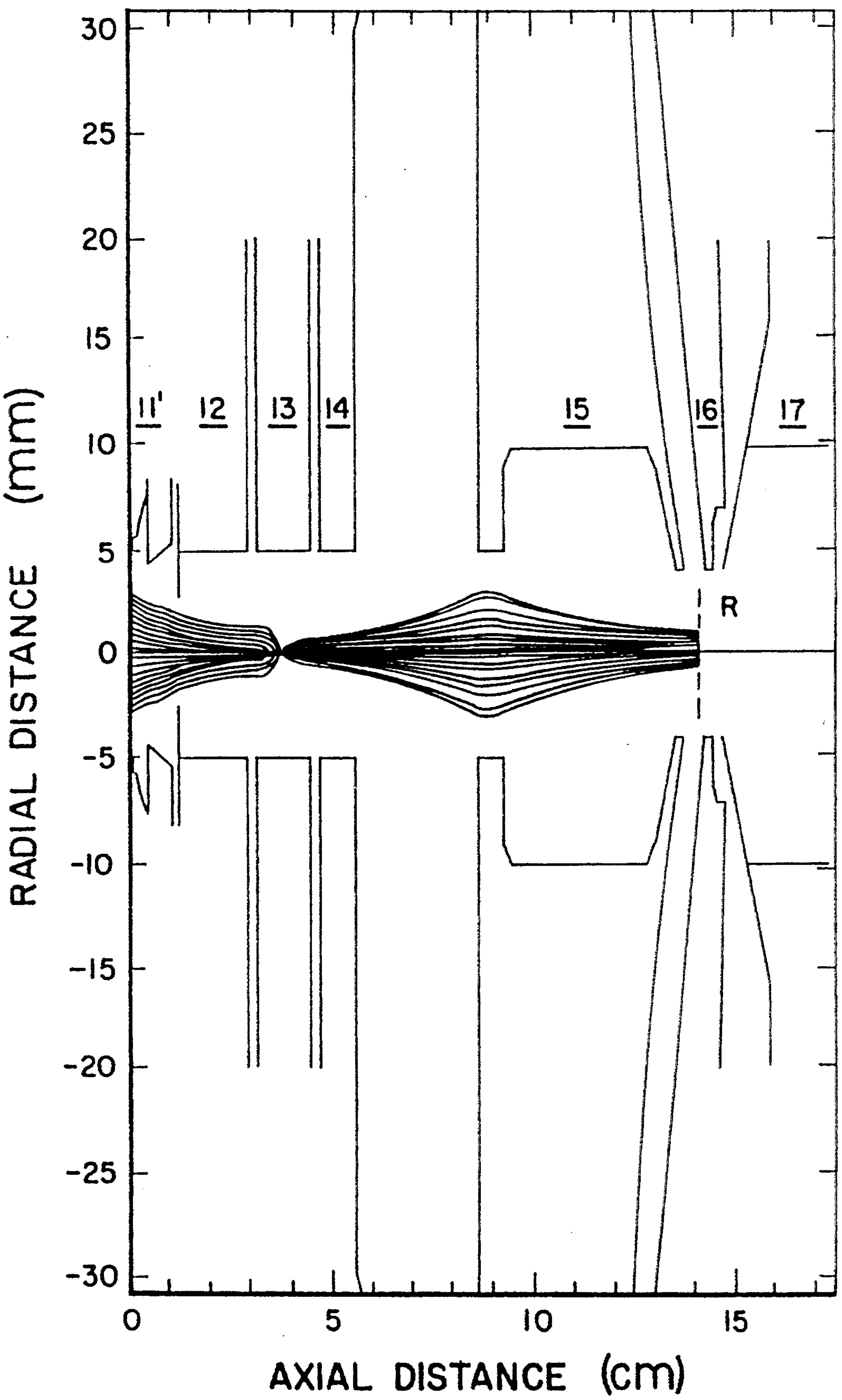
FIG. 2 is a graph of Neumann and Dirichlet boundaries, as well as electron trajectories calculated up to the reversal region R during the electron beam "ON" half cycle.

Critical to the system design and sensitivity is the cathode region which was designed using a cylindrically-symmetric, planar electron emitter. Thus, the electron gun elements 10 through 15 as redesigned consisted of a spherical cathode 10, a "shim" electrode 11', an anode 12 with a 5.2 mm diameter aperture, and an electrode 13 held at near-ground potential. A three-element lens (lenses 13–15) transports the electron beam to an electrostatic mirror (lenses 15–17) where it is reflected back towards the cathode. The Neumann and Dirichlet boundaries, as well as electron trajectories are shown in FIG. 2. The trajectories of the negative ions formed at the region R have been calculated previously as shown in the aforesaid patent and remain unchanged in the present invention.

The starting condition for the design of the electron gun included Child's Law on a spherical cathode with a width $W=8.46\times10^{-3}$ m. The concave face of the electrode was designed with a radius of curvature r such that 2r is greater than that width. The precise radius was determined to be $r=8.2\times10^{-3}$ m by space-charge limited simulations for the present instrument geometry to yield 1 mA current at the reversal region R resulting in an emission area of $5.6\times10^{-5}$ m$^2$. While decreasing the radius of curvature to half the cathode width will result in a true hemispherical surface for maximum electron emission, electrons emitted near the edge of the hemisphere will have an initial direction of motion perpendicular to the axis of the focusing and accelerating lens elements, which will tend to interfere with the desired shape of the beam being formed. Consequently, the optimum for a given width is a ratio of twice the radius of curvature to cathode width $2r/W>1$, or stated differently the width W should be less than 2r. For the present instrument having $W=8.46\times10^{-3}$ m, the optimum ratio was found to be very nearly unity, namely $r/W=0.98$. The design requirements of an electron current $I_e$ of 1 ma at a 650 V acceleration voltage V2 (potential on the anode element V2, with the cathode taken as zero of potential) resulted in a gun perveance $I_e/V2^{3/2}=6.0\times10^{-8}$ A/V$^{3/2}$. In order to have good spatial resolution within the limits of the mesh-point capacity of the program, the problem of boundaries describing the electron gun portion (11–17) was split into two parts: part 1 included the electrodes 11, 11', 12, 13, 14; and part 2 the electrodes 12–17. Three electrodes 13–15 were made common to both parts to insure that fringing fields from part 1 were included in part 2. The mesh size in part 1 (0.43 mm/mesh unit) was one third that of part 2 to be able to resolve small details in the gun structure. After running part 1, the output trajectories were injected (as initial conditions) into part 2 at a position on the lens axis where the potential was identical in both parts. Typical values of the voltages used to compute the trajectories in FIG. 2 are V1=0 V, V1'=150 V, V2=650 V, V3=2 V, V4=1340 V, V5=112V, V6−30 V and V7=−30 V. The total electron current calculated in the program was 1 ma, and the beam diameter at R was 3.5 mm.

Sensitivity Tests

Using the method of standard dilutions, the sensitivity of the new version of the apparatus shown in FIG. 1 was measured. Test mixtures of $CCl_4$ or in $N_2$ were prepared. At zero electron energy $Cl^{31}$ is the only fragment ion produced in dissociative attachment to $CCl_4$; while the c-$C_6F_6^-$ molecular ion is the only product in attachment to c-$C_6F_6$. With their large attachment cross sections peaking at zero energy, these molecules served as good simulants of the nitrogen-containing explosives currently in use. Naturally, the ultimate sensitivity with the explosives themselves will depend on their attachment cross sections. To date, these have not been measured in any explosives molecule by any technique.

Sample mixtures were prepared in an all-stainless steel vacuum system. All lines were kept warm at 370 K to prevent "sticking" of the sample to the walls during preparation and transfer to the collision region. Targets were used in their reagent grade and subjected to ten freeze-thaw cycles to remove dissolved gases. They were mixed with $N_2$ (99.99% purity) in a concentration ratio C (particle density)=1 (pure target) to $1\times10^{-11}$. The quadrupole mass spectrometer was tuned to either m/e=35 or 186, and the negative-ion signals measured as a function of the fractional concentration C. In addition, in order to understand the signal linearity properties of the apparatus, a series of measurements of count vs electron current was made at three values of $C=1\times10^{-4}$, $1\times10^{-2}$ and 1. The total pressure in the main vacuum chamber (not shown) was fixed at $2.7\times10^{-5}$ Pa($2.0\times10^{-7}$ torr) throughout.

Figure 3:
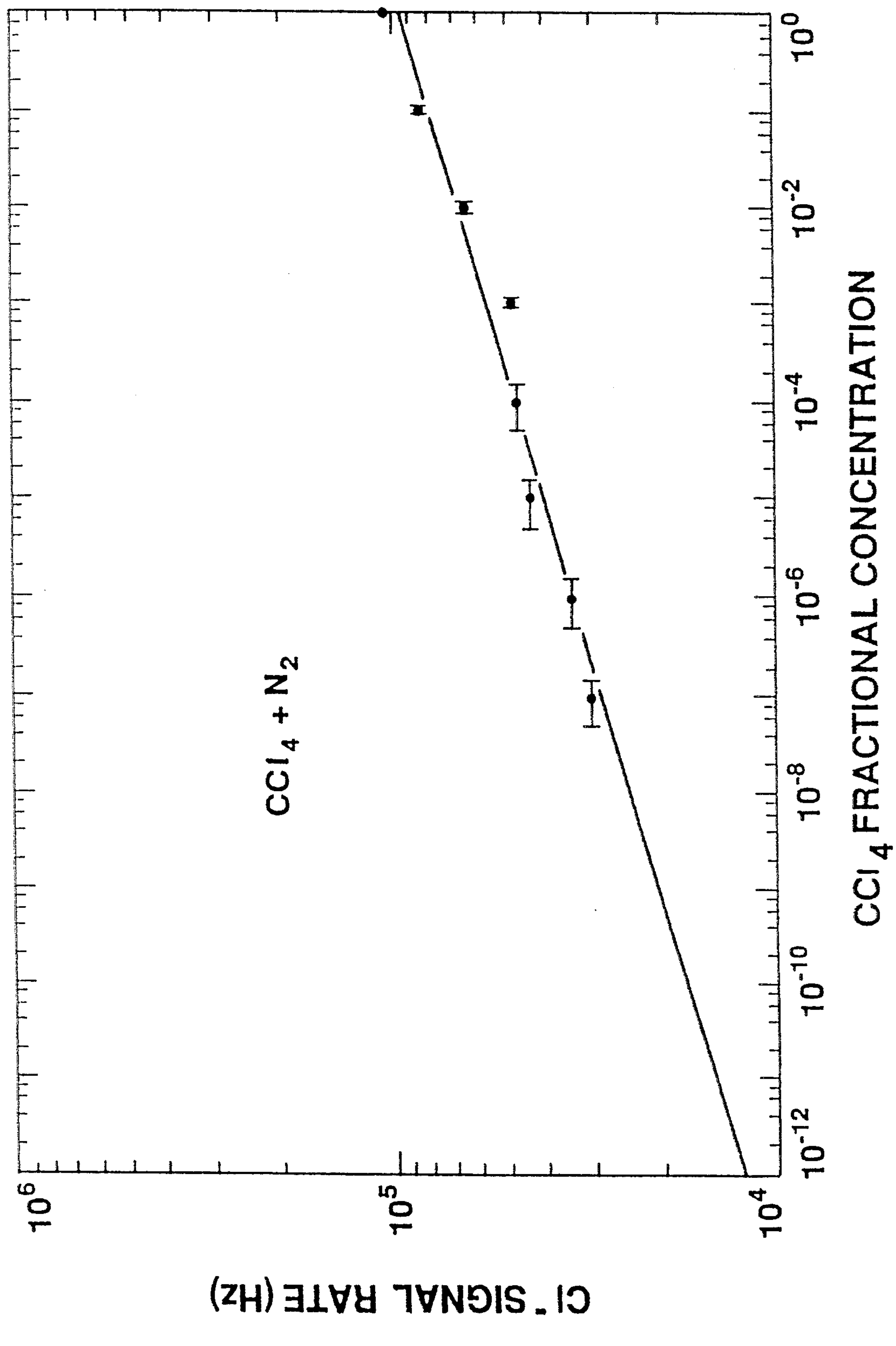
FIG. 3 is a graph of sensitivity of the apparatus of FIG. 1 using the method of standard dilutions for various concentrations C of $CCl_4$ in $N_2$, in which the solid line represents a least-square fit to the data.
Figure 4:
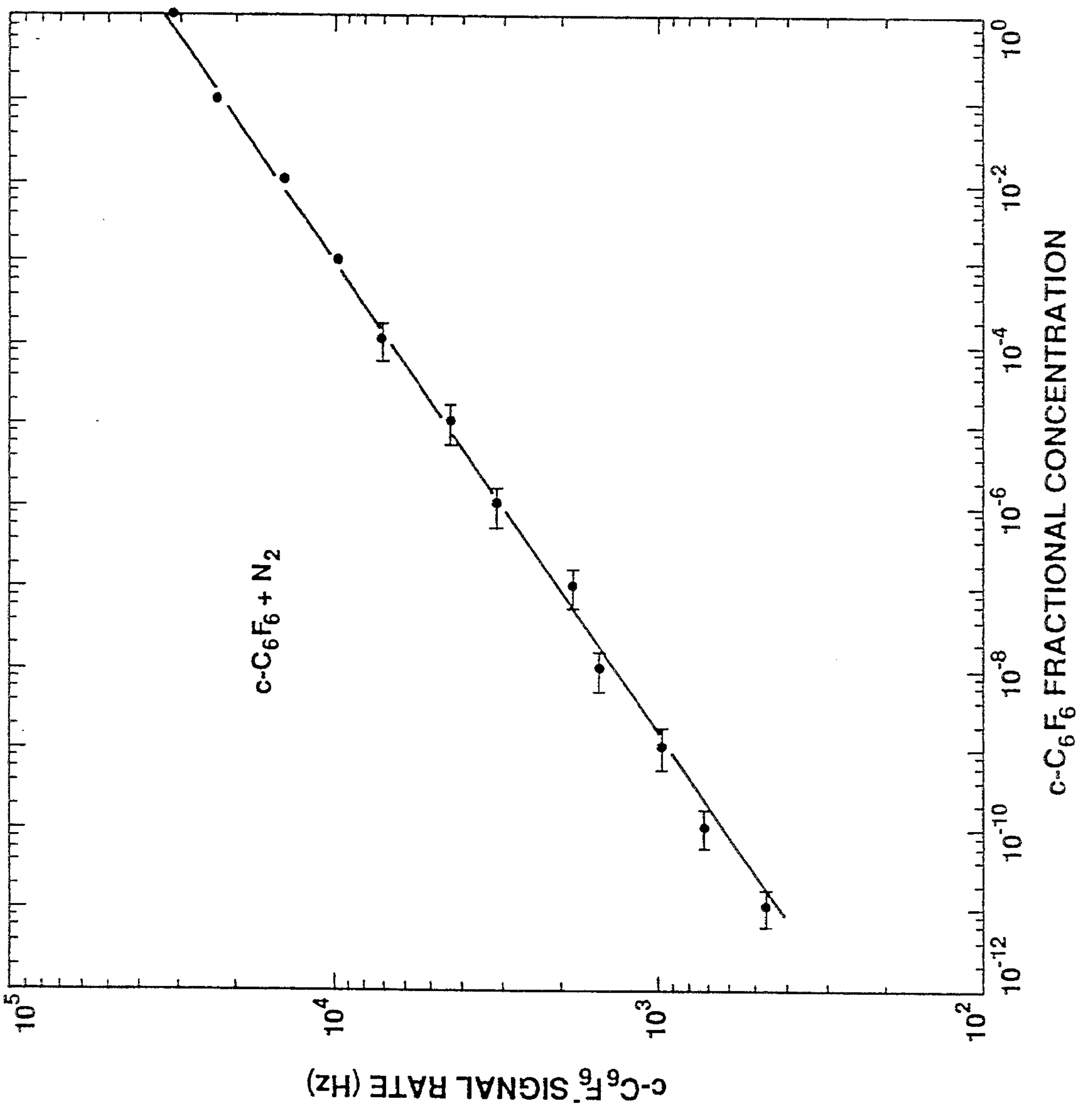
FIG. 4 is the same for c–$C_6F_6$ as the target sample.

Between all measurements where C was changed, the lens system was baked to 415 K using a quartz-iodine lamp placed near the collision region. This served to remove residual target molecules from the immediate inlet lines and surfaces and prevented "memory" effects in the measurements. A 10 minute baking time was sufficient to remove residual c-$C_6F_6$, but a 2 hour bake was required to remove the "stickier" $CCl_4$. Blank runs were performed and the background measured to be only electronic-noise background in the mass ranges 30–40, or 180–190 amu before introduction of the next mixture. At each concentration, the signal was monitored over a period of 0.5 hours to insure stability of the mixture at the 3% level. Results of sensitivity curves obtained for $CCl_4$ and c-$C_6F_6$ are shown in FIGS. 3 and 4, respectively. The errors represent the quadrature sum of the statistical counting error and the error in reading the two pressure gauges used to make up each fraction C, and are expressed at the 1.7 (90%) confidence level. In the case of $CCl_4$ at a common concentration of 10 pptr, the signal rate is approximately 25 times greater in the present invention than in the earlier planar apparatus shown in the aforesaid patent with a cathode. Count rates with c-$C_6F_6$ are lower than with $CCl_4$, consistent with the smaller attachment cross section and rate constant for the former. Also, from FIG. 3, one may extrapolate to a count rate of 13 kHz at a mixture $C=1\times10^{-12}$ and 7.5 kHz at $C=1\times10^{-15}$. As a caveat, however, such extrapolations must be viewed with caution, since in both cases the sensitivity curves deviate from a slope of unity. The principal nonlinear effect in the system is that of ion space charge.

Space-Charge Effects

In many applications of a trace-analysis instrument, for example in air or water pollution monitoring, one would like to relate a measured signal intensity to a sample concentration in a linear fashion. However, in some applications, such as in detection of explosives, one is more interested in the presence of a sample, regardless of concentration.

To explore the dependence of the output signal on target density and electron current, a series of measurements with $CCl_4$ was carried out at three values of $C=10^{-4}$, $10^{-2}$ and 1.0, and over the range of electron currents $I_c=1.0\times10^{-5}$ to $3.0\times10^{-4}$ A. This approach was preferred to the method of FIGS. 3 and 4 since the electron current is the only variable and the optical properties are left unchanged for each value of concentration C.

Figure 5:
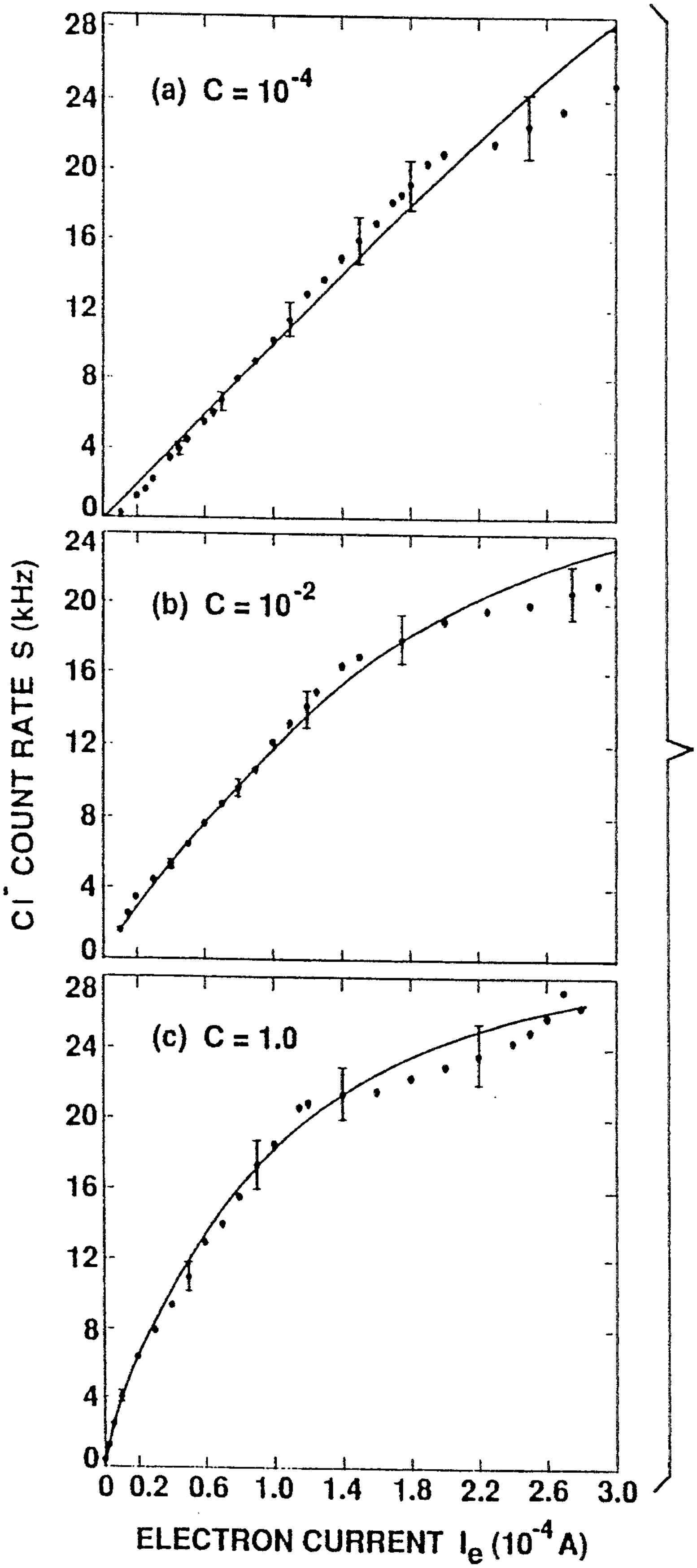
FIG. 5 shows graphs of negative-ion $Cl^-$ signal vs $I_e$ for three concentrations, (a) $C=1\times10^{-4}$, (b) $C=1\times10^{-2}$, and (c) $C=1.0$ (pure $CCl_4$), where solid lines are calculated lines to data using Equation (6).

Shown in FIG. 5 are results for the three concentrations. In general, two regions of slope can be distinguished: (a) the Cl− signal rate is near linear at low $I_e$, followed by (b) a marked flattening of the signal at higher electron currents $I_e$. Results at the higher currents correspond, as will be shown below, to ions being lost by a rapid expansion due to space charge and leaving the field of view of the ion extraction lens system 15–18.

The physical picture adopted in understanding the shape of the sensitivity curves is that of a spherical ball of ions created at R by the dissociative attachment process during the electron ON cycle. There is a time delay Δt introduced between the electron OFF cycle and the ion ON cycle. This delay is set experimentally at Δt=2.1 μs and is a "settling time" for the electrons prior to pulsing out the ions. During this time, the negative-ion cloud expands under the action of the space-charge force of the negative ions (electrons are OFF), the initial velocity of ion formation, and small fringing electric fields from lens element 18, deflectors in lens element 15, etc. The ion density within this cloud increases with increasing concentration C and electron current $I_e$. The resulting increase in ion-ion repulsion will lead to a larger expansion velocity for the sphere and hence a large final radius $r_f$ after the delay Δt. The ion extraction system comprising lens elements 15–18 is only capable of focusing an ion ball of less than a certain radius $r_f$. This is calculated from the space-charge trajectory code to be $r_f=3.35$ mm for the present system.

Figure 6:
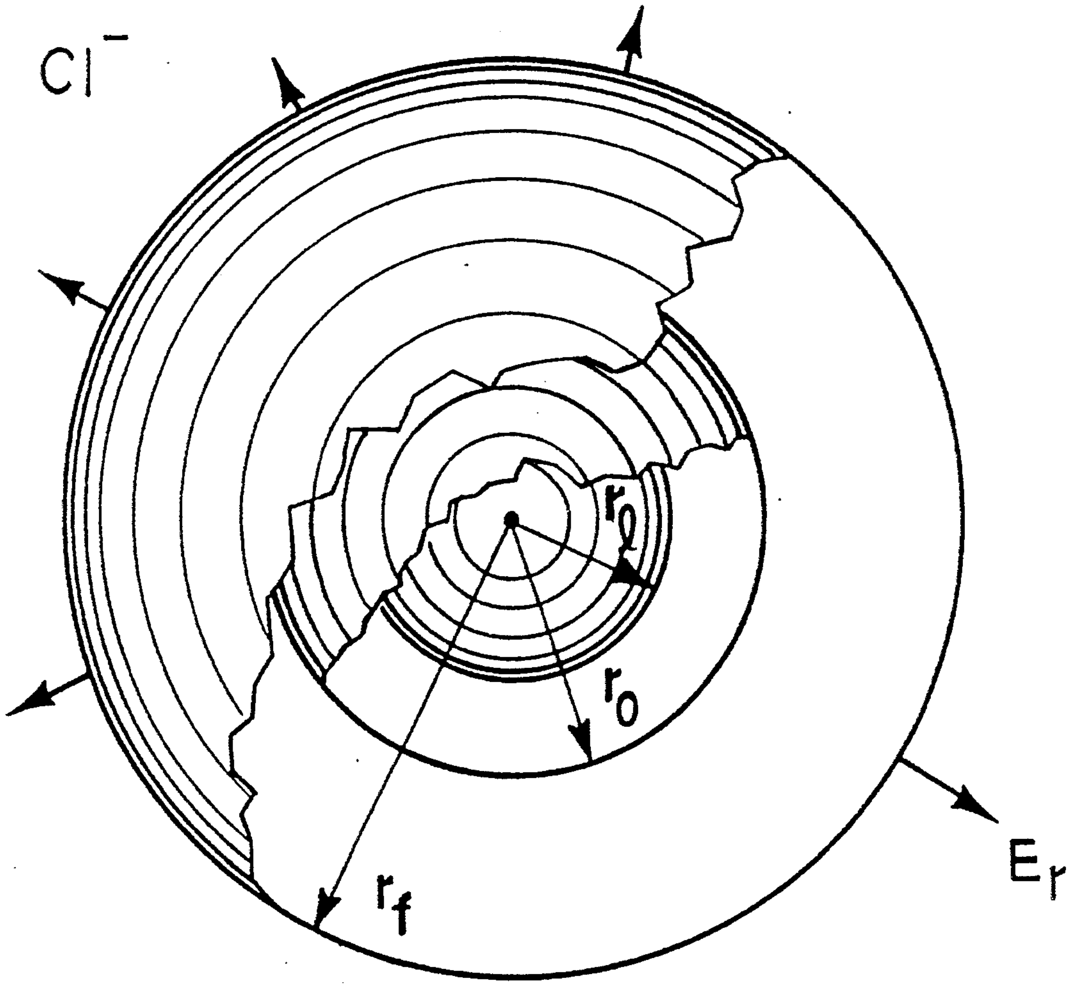
FIG. 6 illustrates the geometry for the spherical ball of negative ions formed at the reversal region R as the cloud of ions formed by dissociative attachment expands.

Referring to FIG. 6, one has a sphere of initial radius $r_0$ as set by the radius of the initial electron beam. During the period Δt in which the electrons are turned off, some portion of the sphere (radius $r_l$) expands to a radius $r_f$ by the combined velocities of space-charge repulsion and initial velocity of ion formation in the dissociative attachment process. The ions within that sphere are focused by the ion lens system, mass-analyzed, and detected. (The outer $r_0$ edge can expand beyond $r_f$, but those ions will be lost.)

At any concentration C and electron current $I_e$ the extracted ion signal S will be given simply by $$S(Hz) = \kappa\rho\left(\frac{4}{3}\pi r_l^3\right) \qquad (1)$$

where K is an instrument transmission and detection efficiency, ρ is the ion charge density contained within the sphere of radius $r_0$, and $$\frac{4}{3}\pi r_l^3.$$

the volume of detected ions. The product $$\rho\left(\frac{4}{3}\pi r_l^3\right)$$

is the number of ions contained within the sphere of radius $r_l$. To determine $r_l$, one calculates the radial electric field $E_r$ at any radius r due to a charge density ρ contained within a radius $r_0$. This is given from Gauss's Law as (MKS units)

$$E_r = \frac{r_0^3}{3\epsilon_0 r^2}\rho \qquad (2)$$

where $1/\epsilon_0=36\pi10^9$. From the relation $e\,dV=e\,E_r\,dr=mv\,dv$, one obtains $$v\,dv = (e/3\epsilon_0 m)\left(\frac{r_0^3}{r^2}\right)\rho\,dr \qquad (3)$$

where m is the $Cl^{31}$ mass and e the electron charge. Upon integrating one obtains the radial velocity (letting $$K = \frac{2_e}{3\epsilon_0 m} r_0^3\rho,$$

and $A=v_0^2+K/r_0$), $$v=dr/dt=(A-K/r)^{\frac{1}{2}} \qquad (4)$$

In time Δt the sphere surface at $r_l$ will have moved to the distance $r_f$ determined by the integral of Equation (4), $$\Delta t = \int_{r_l}^{r_f}\frac{dr}{(A-K/r)^{\frac{1}{2}}} \qquad (5)$$

This can be evaluated in closed form to give $$\left[\text{letting } u = \left(1-\frac{K}{Ar}\right)^{\frac{1}{2}}\right]$$

$$\Delta t = \frac{K}{A^{3/2}}\left[\frac{u}{1-u^2} + \ln\left(\frac{1+u}{\sqrt{1-u^2}}\right)\right]_{u_l}^{u_f} \qquad (6)$$

For a given interval Δt, the value of $r_l$ was determined from Equation (6) at each ρ, C and $I_e$. The charge density ρ the only adjusted parameter and may be calculated from the standard expression for the attenuation of an electron beam of length 1 and radius $r_0$ through a thin target beam of density n, $$\rho = \frac{I_e n\sigma l}{V_0} \qquad (7)$$

where $a=\pi r_0^2$, and σ is the attachment cross section, taken as $5\times10^{-17}$ $m^2$. Values of the parameters used are listed in Table I together with the final calculated value of ρ.

TABLE I

| | Values of Parameters Used in the Space-Charge Calculation | | |
|---|---|---|---|
| C | 1 | $10^{-2}$ | $10^{-4}$ |
| $10^4 I_e$(A) | 1(varied) | 1(varied) | 1(varied) |
| n($m^{-3}$) | $2\times10^{17}$ | $2\times10^{15}$ | $2\times10^{13}$ |
| $10^{17}\sigma$($m^2$) | 5 | 5 | 5 |
| $10^4 l$(m) | 1.0 | 4.6 | 9.0 |
| $10^{-2}v_0$(m/s) | 8.8 | 8.8 | 8.8 |
| a($m^2$) | $6.3\times10^{-5}$ | $7.5\times10^{-6}$ | $1.0\times10^{-6}$ |

TABLE I-continued

| | Values of Parameters Used in the Space-Charge Calculation | | |
|---|---|---|---|
| C | 1 | $10^{-2}$ | $10^{-4}$ |
| $10^3 r_f$(m) | 1.25 | 1.39 | 1.51 |
| $\rho$(C/m$^3$) | $1.8 \times 10^{-6}$ | $7.0 \times 10^{-7}$ | $1.0 \times 10^{-7}$ |

The fifth row of Table I is calculated to be approximately one-third of a mesh unit, or $4.3 \times 10^{-4}$ m. The sixth row uses 0.14 eV for the $Cl^-$ energy at onset, and is measured to be 0.100 eV. In the seventh row the electron beam area is calculated to be $\pi r_0^2 = 9.62 \times 10^{-6}$ m$^2$. Since only the ratio 1/a is determined from Equation (7), their individual values are not unique but were kept reasonably close to trajectory-calculated results. The value for $v_0$, corresponding to a $^{35}Cl^-$ energy of 0.14 eV, is comparable to the formation energy (0.100 eV) measured for the DA process. (The slightly larger value here can arise from accelerations through fringing fields at R.) The value of n is an estimate from the pressure in the main chamber during operation, and that for $\sigma$ an estimate based on the known attachment cross section for $CCl_4$.

Results of the calculation are given as the solid lines in FIG. 5. The agreement, especially in the pure $CCl_4$ case (greatest linearity) is surprisingly good for this simple model. The calculation reveals both a linear and a nonlinear region. The linear region extends to higher $I_e$ as the concentration of target is reduced to $C = 10^{-2}$ and $10^{-4}$ (lower charge density $\rho$) in agreement with the experimental results.

It is interesting to note that the charge density $\rho$ does not scale with the target density between $C = 10^{-4}$ and $C = 1.0$. This results from the fact that the electron- and ion-beam tuning conditions are changed between measurements at each concentration. To show this, a separate series of measurements was made at concentrations $C = 10^{-2}$, $10^{-1}$, and 1.0. The electron current was kept low ($I_e = 0.051 \times 10^{-4}$ A) to minimize ion space-charge effects; and the optics were not retuned between concentration changes. In this case, the $Cl^-$ signal and concentration scaled linearly (at the $2\sigma$ or 98% confidence level) as 1.00:10.8:118 for the concentrations $10^{-2}$:$10^{-1}$: 1.0. And hence the detection response at small $I_e$ and fixed tuning conditions is linear with $\rho$.

Assumptions in the model are (1) neglect of space charge neutralization due to positive ions $N_2^+$, $N^+$, $N_2^{+2}$, $CCl_3^+$, etc.), (2) use of a spherical ball due to the use of spherical cathode rather than a cylinder of charge generated by a near-cylindrical beam of electrons slowing into the mirror region (compare the calculated geometry in FIG. 2 with that in FIG. 3 of the aforesaid patent), (3) a uniform electron density distribution within the radius of formation $r_0$, (4) a uniform gas target density distribution at R, and (5) neglect of fringing-field gradients at R which would produce a distribution of starting velocities $v_0$. These effects can, in principle, be included in a more detailed calculation, but would very likely involve further parameters and detract from the simplicity of the present model. This one-parameter calculation gives good agreement with experiment, and captures the main feature of the space-charge effects.

We claim:

1. In a reversal electron ionizer for trace species detection, a high electron current source comprising a spherical cathode for emitting a high current of thermal energy electrons, means for electrostatically focusing said thermal energy electrons into a beam along a predetermined axes to a reversal plane, and means for electrostatically reversing trajectories of said thermal energy electrons, whereby said thermal energy electrons are converted to high current zero-energy electrons at said reversal plane for attachment by trace species of a sample introduced into a region of said reversal plane.

2. A high electron current source for a reversal electron ionizer as defined in claim 1 wherein said cathode has a width less than twice the radius of curvature.

3. A high electron current source for a reversal electron ionizer as defined in claim 2 wherein said cathode has a ratio of width to radius of curvature approximately equal to one.

* * * * *